United States Patent
Chi et al.

(10) Patent No.: US 9,567,668 B2
(45) Date of Patent: Feb. 14, 2017

(54) PLASMA APPARATUS, MAGNETIC-FIELD CONTROLLING METHOD, AND SEMICONDUCTOR MANUFACTURING METHOD

(71) Applicant: Taiwan Semiconductor Manufacturing Co., Ltd., Hsin-Chu (TW)

(72) Inventors: Chih-Chien Chi, Hsinchu (TW); Shing-Chyang Pan, Jhudong Township, Hsinchu County (TW); Kuan-Chia Chen, Hsinchu (TW); Yao-Jen Chang, Taipei (TW); Huang-Yi Huang, Hsinchu (TW); Ching-Hua Hsieh, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 80 days.

(21) Appl. No.: 14/183,670

(22) Filed: Feb. 19, 2014

(65) Prior Publication Data

US 2015/0235823 A1    Aug. 20, 2015

(51) Int. Cl.
| | |
|---|---|
| C23C 14/34 | (2006.01) |
| C23C 14/35 | (2006.01) |
| H01J 37/34 | (2006.01) |
| C23C 14/54 | (2006.01) |

(52) U.S. Cl.
CPC ............ *C23C 14/35* (2013.01); *C23C 14/3492* (2013.01); *C23C 14/542* (2013.01); *H01J 37/3405* (2013.01); *H01J 37/3452* (2013.01); *H01J 37/3455* (2013.01); *H01J 37/3458* (2013.01)

(58) Field of Classification Search
CPC .......................... C23C 14/35; C23C 14/3492
See application file for complete search history.

(56) References Cited

U.S. PATENT DOCUMENTS

| | | | | |
|---|---|---|---|---|
| 3,616,405 | A * | 10/1971 | Beaudry | 204/192.12 |
| 5,047,130 | A * | 9/1991 | Akao | C23C 14/3407 |
| | | | | 204/192.12 |
| 5,631,618 | A * | 5/1997 | Trumper | G03F 7/70758 |
| | | | | 104/286 |
| 2004/0050690 | A1* | 3/2004 | Green et al. | 204/192.13 |

* cited by examiner

*Primary Examiner* — Jason M Berman
(74) *Attorney, Agent, or Firm* — McClure, Qualey & Rodack, LLP

(57) ABSTRACT

Embodiments of a plasma apparatus are provided. The plasma apparatus includes a processing chamber and a wafer chuck disposed in the processing chamber. The plasma apparatus also includes a target element located over the wafer chuck and an electromagnet array located over the target element and having a number of electromagnets. Some of the electromagnets in a magnetic-field zone of the electromagnet array are enabled to generate a magnetic field adjacent to the target element. The magnetic-field zone is moved during a semiconductor manufacturing process.

20 Claims, 9 Drawing Sheets

PLASMA APPARATUS, MAGNETIC-FIELD CONTROLLING METHOD, AND SEMICONDUCTOR MANUFACTURING METHOD

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a wafer, and patterning the various material layers using lithography to form circuit components and elements thereon. Many integrated circuits are typically manufactured on a single wafer, and individual dies on the wafer are singulated by sawing between the integrated circuits along a scribe line. The individual dies are typically packaged separately, in multi-chip modules, or in other types of packaging, for example.

To selectively form processing layers in a desired location, the processing layers are often deposited, masked, and then etched in unmasked areas using a plasma process.

Although existing devices and methods for plasma processing have been generally adequate for their intended purposes, they have not been entirely satisfactory in all respects. Consequently, it would be desirable to provide a solution for improving the plasma process.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. It is understood that additional operations can be provided before, during, and after the method, and some of the operations described can be replaced or eliminated for other embodiments of the method.

A plasma apparatus and a magnetic-field controlling method are provided. The metal atoms, generated by a semiconductor manufacturing process, emitting to the wafer can be controlled accurately and uniformly.

Figure 1:
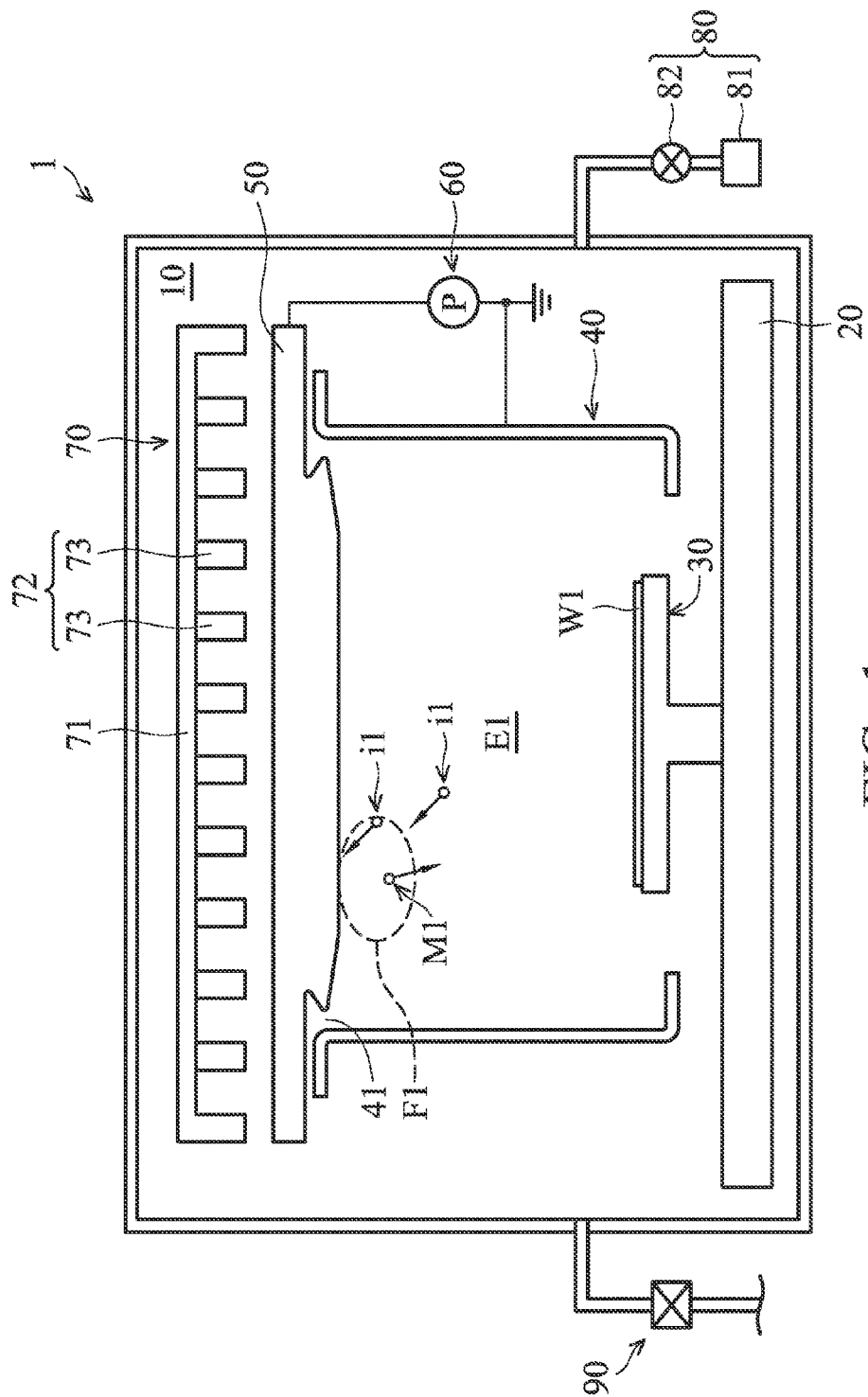
FIG. 1 is a schematic view of a plasma apparatus in accordance with some embodiments of the disclosure.

FIG. 1 is a schematic view of a plasma apparatus 1 in accordance with some embodiments of the disclosure. The plasma apparatus 1 is configured to perform a semiconductor manufacturing process on a wafer W1. In some embodiments, the semiconductor manufacturing process is an etching process, a physical vapor deposition (PVD) process or a sputtering deposition process.

The plasma apparatus 1 includes a plasma chamber 10, a base 20, a wafer chuck 30, an enclosure element 40, a target element 50, a power source 60, and a magnetic field generator 70, a gas supply device 80, and a vacuum device 90. The base 20 is disposed in the plasma chamber 10. The wafer chuck 30 is disposed on the base 20 in the plasma chamber 10. The base 20 is configured to support the wafer chuck 30. The wafer chuck 30 is configured to hold the wafer W1.

The enclosure element 40 is disposed in the plasma chamber 10. In some embodiments, the enclosure element 40 is a tubular structure. The enclosure element 40 is around the wafer chuck 30. The enclosure element 40 is made of conductive material. In some embodiments, the enclosure element 40 includes aluminum, copper, or steel, and their combinations.

The target element 50 is disposed over the enclosure element 40 in the plasma chamber 10. In some embodiments, the target element 50 covers a top opening 41 of the enclosure element 40. The target element 50 is separated from the enclosure element 40. Furthermore, the target element 50 is located over the wafer chuck 30. The target element 50 is made of conductive material. In some embodiments, the target element 50 includes copper, tantalum, aluminum, cobalt, or tungsten, and their combinations.

The power source 60 is electrically connected to the enclosure element 40 and the target element 50. In other words, the enclosure element 40 and the target element 50 are the electrodes of the power source 60. The power source 60 is configured to apply power to the enclosure element 40 and the target element 50 during the semiconductor manufacturing process. When the power source 60 is enabled, an electric field is generated by the enclosure element 40 and the target element 50 in the plasma chamber 10. In some embodiments, the power applied by the power source 60 is in a range from about 100 watt to about 60 kwatt.

The magnetic field generator 70 is disposed over the target element 50. The magnetic field generator 70 is configured to generate a magnetic field adjacent to the target element 50 during the semiconductor manufacturing process. The plasma apparatus 1 includes a retaining element 71 and an electromagnet array 72. The electromagnet array 72 is disposed on the retaining element 71. The electromagnet array 72 includes a number of electromagnets 73.

The gas supply device 80 is in communication with the plasma chamber 10. The gas supply device 80 is configured to transfer a gas into the plasma chamber 10. In some embodiments, the gas includes $N_2$, Ar, $O_2$, $NH_3$ or Ne, and their mixtures. The gas supply device 80 further includes a gas tank 81 and a mass flow controller 82. The gas tank 81 contains the gas. The gas in the gas tank 81 flows into the plasma chamber 10 via the mass flow controller 82. The mass flow controller 82 is configured to control the flow rate of the gas flowing into the plasma chamber 10.

The vacuum device 90 is in communication with the plasma chamber 10. The vacuum device 90 is configured to maintain the plasma chamber 10 at a low-pressure environment. In some embodiments, the low-pressure environment has a pressure in a range from about 1 mtorr to about 10 torr.

Figure 2:
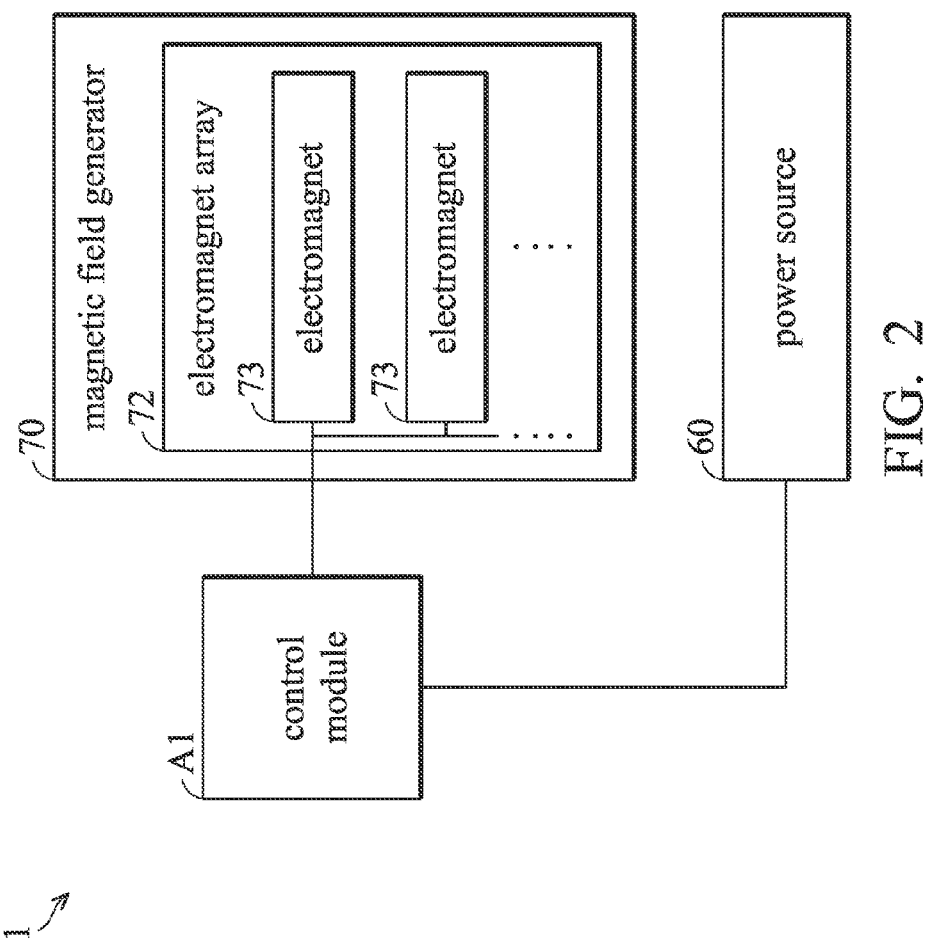
FIG. 2 is a function block diagram of the plasma apparatus in accordance with some embodiments of the disclosure.

FIG. 2 is a function block diagram of the plasma apparatus 1 in accordance with some embodiments of the disclosure. The plasma apparatus 1 further includes a control module A1. The control module A1 is electrically connected to the electromagnets 73 and the power source 60.

The control module A1 is configured to switch each of the electromagnets 73. Furthermore, the control module A1 is configured to control the direction of the current flow applied to each of the electromagnets 73. The control module A1 is also configured to control the power source 60. Furthermore, the control module A1 is configured to control the power output by the power source 60.

Figure 3A:
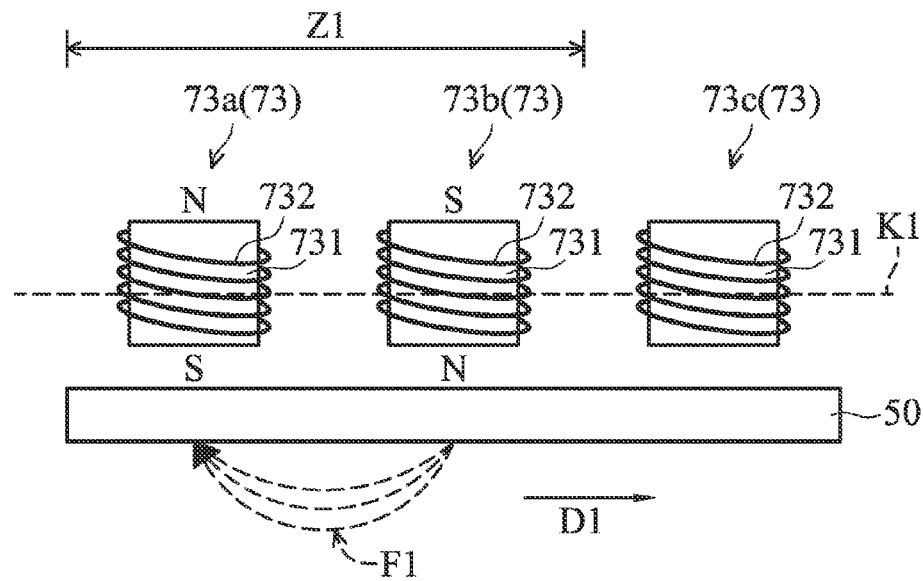
FIGS. 3A and 3B are schematic views of a number of electromagnets and a target element during a magnetic-field controlling method in accordance with some embodiments of the disclosure.
Figure 3B:
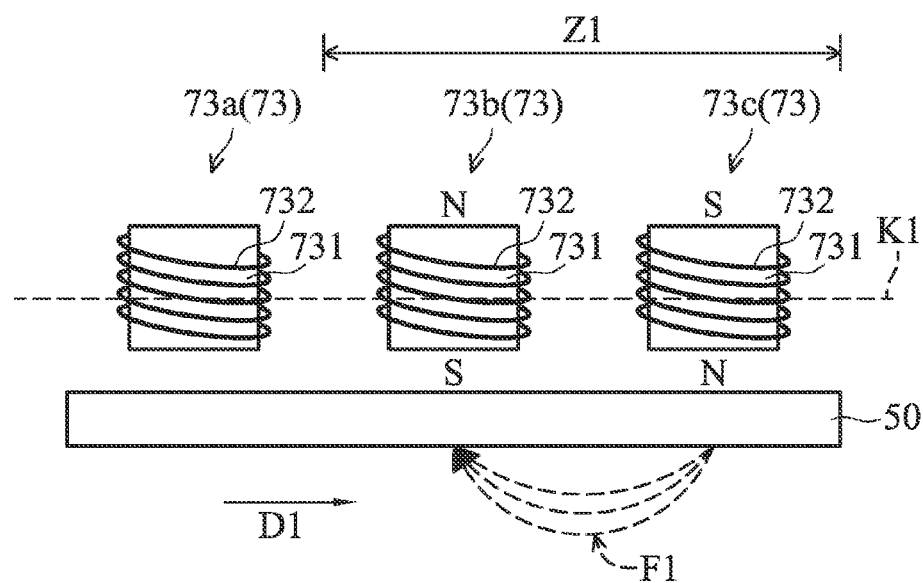

FIGS. 3A and 3B are schematic views of the electromagnets 73 and the target element 50 during a magnetic-field controlling method in accordance with some embodiments of the disclosure. The electromagnets 73 are located at a plane K1. Each of the electromagnets 73 includes a magnetic element 731 and a wire 732. The magnetic elements 731 are parallel to each other. In some embodiments, the magnetic element 731 includes iron. The wire 732 is wired on the magnetic element 731. When the wire 732 conducts electricity, the magnetic element 731 is magnetized and generates a magnetic field. Moreover, the polarity of the magnetic element 731 is changed by reversing the direction of the current flowing in the wire 732. The magnetic field generated by the electromagnet 73 is enhanced by increasing the current in the wire 732.

A magnetic-field controlling method is performed to the magnetic field generator 70 during a semiconductor manufacturing process. For example, as shown in FIG. 3A, the electromagnets 73a and 73b are enabled. The south pole S of the electromagnet 73a is at the bottom of the electromagnet 73a adjacent to the target element 50. The north pole N of the electromagnet 73b is at the bottom of the electromagnet 73b adjacent to the target element 50. Therefore, a magnetic field F1 adjacent to the target element 50 is generated by the electromagnets 73a and 73b. In other words, the magnetic field F1 is formed in a magnetic-field zone Z1. The electromagnets 73a and 73b in the magnetic-field zone Z1 are enabled, and the electromagnet 73c out of the magnetic-field zone Z1 is disabled.

As shown in FIG. 3A, after a switch time, the location of the magnetic-field zone Z1 is adjusted along a moving direction D1 by switching the electromagnets 73a, 73b and 73c. The electromagnets 73b and 73c in the magnetic-field zone Z1 are enabled, and the electromagnet 73a out of the magnetic-field zone Z1 is disabled. In some embodiments, the switch time is in a range from about $10^{-3}$ seconds to about 1 second.

Furthermore, the south pole S of the electromagnet 73b is at the bottom of the electromagnet 73b since the current flow in the electromagnets 73b is reversed. The north pole N of the electromagnet 73c is at the bottom of the electromagnet 73c adjacent to the target element 50. As shown in FIGS. 3A and 3B, after the switch time, a location of the magnetic field F1 is adjusted along the moving direction D1 by switching the electromagnets 73a, 73b and 73c, and the location of the magnetic-field zone Z1 is moved following the magnetic field F1. Therefore, as shown in FIGS. 1, 3A and 3B, the metal atoms M1 uniformly emit to the wafer W1 due to the movement of the magnetic field F1.

Figure 4A:
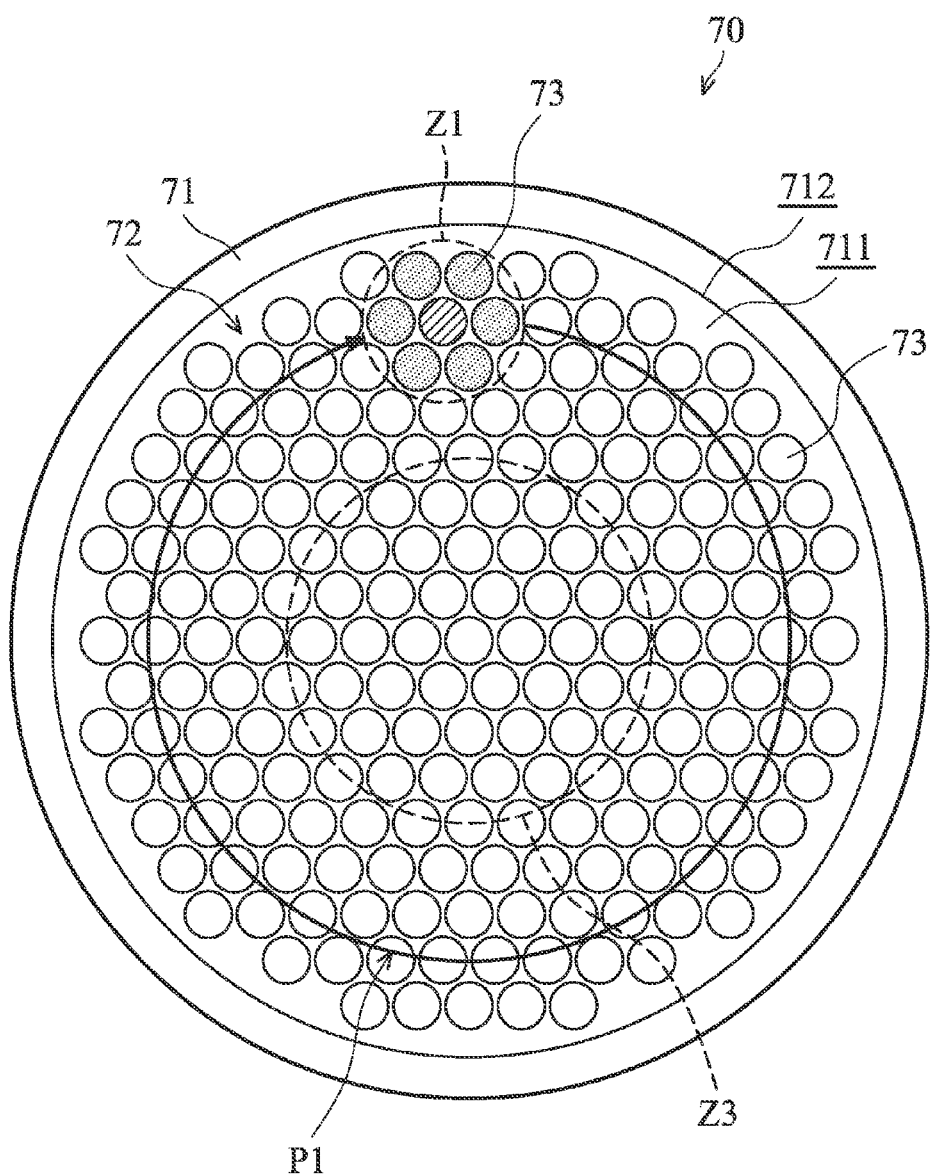
FIGS. 4A, 4B and 4C are bottom views of a magnetic field generator in accordance with some embodiments of the disclosure.
Figure 4B:
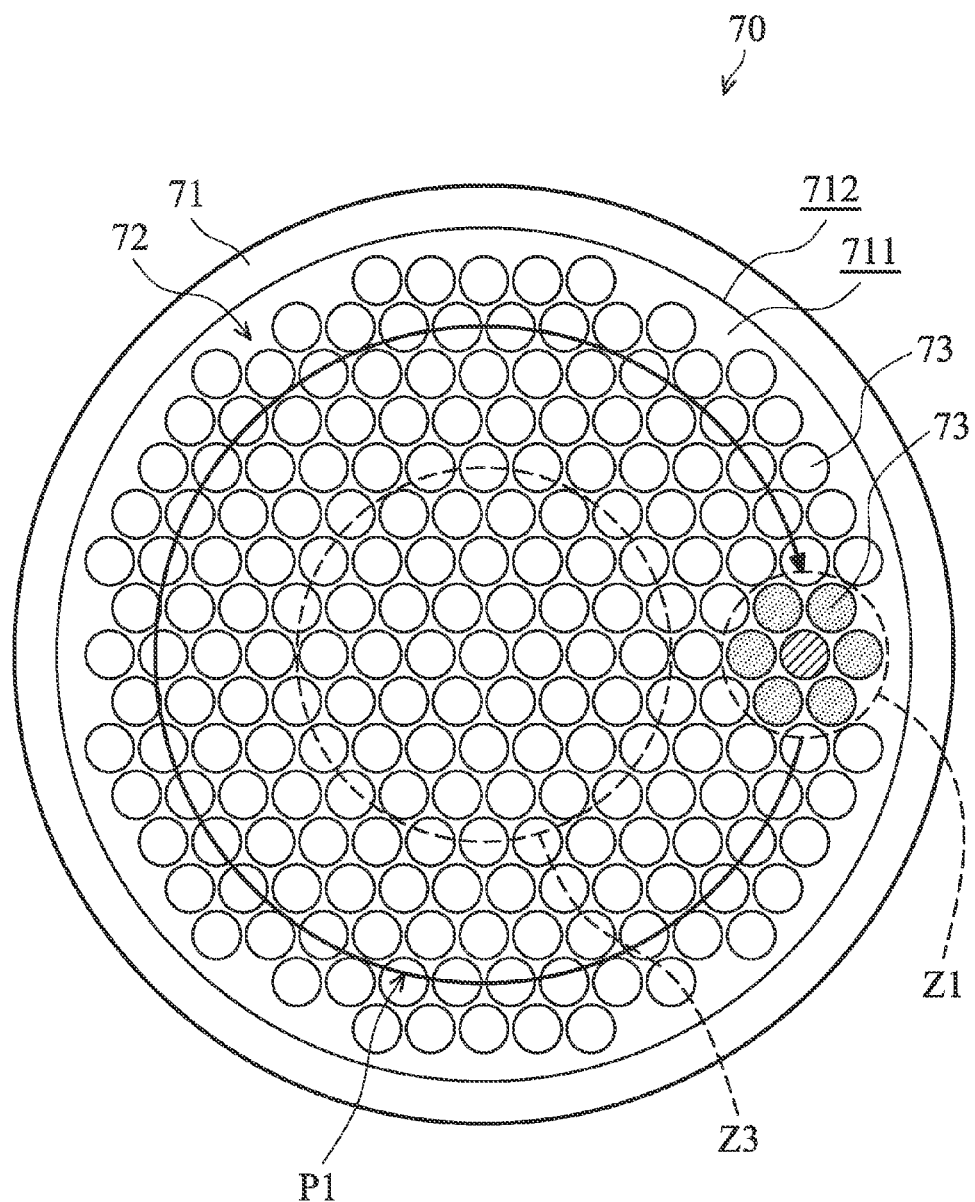
Figure 4C:
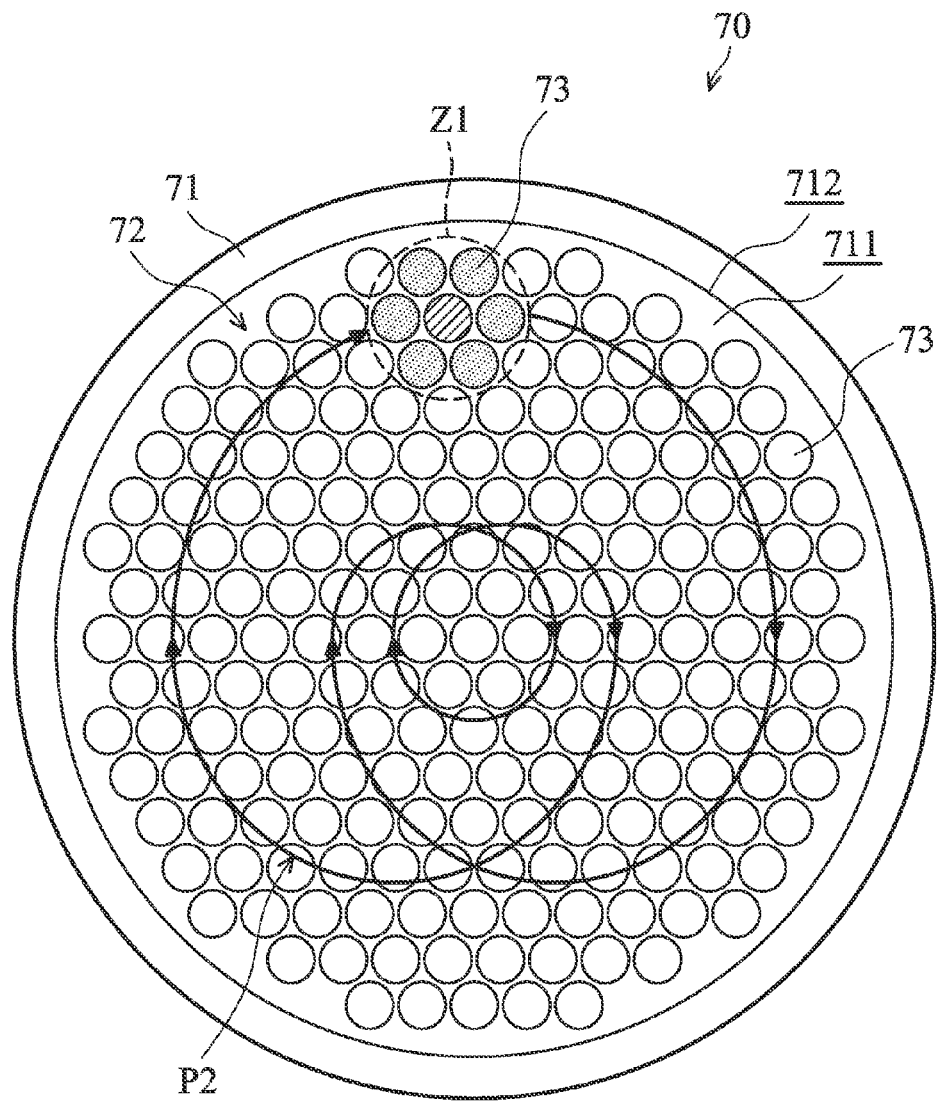

FIGS. 4A, 4B and 4C are bottom views of the magnetic field generator 70 in accordance with some embodiments of the disclosure. In some embodiment, the retaining element 71 is a plate structure. The retaining element 71 is a circular shape. In some embodiments, the retaining element 71 has a receiving groove 711. The receiving groove 711 has a ring-shaped wall 712. The electromagnet array 72 is disposed in the receiving groove 711. In some embodiments, the electromagnet array 72 is a circular shape. The electromagnets 73 are arranged in the receiving groove 711 in an array. In some embodiments, the electromagnets 73 are arranged in a circular shape along the ring-shaped wall 712.

In some embodiments, the number of electromagnets 73 in the magnetic field generator 70 is in a range from about 20 to about 10000. For example, the number of electromagnets 73 in the magnetic field generator 70 is in a range from about 300 to about 500. In some embodiments, the number of electromagnets 73 per square meter is in a range from about 300 to about 2000.

As shown in FIGS. 4A and 4B, some of the electromagnets 73 are in a magnetic-field zone Z1. The electromagnets 73 in the magnetic-field zone Z1 are enabled by the control module A1 (as shown in FIG. 2). Furthermore, the electromagnets 73 out of the magnetic-field zone Z1 may be disabled by the control module A1. In some embodiments, the number of electromagnets 73 in the magnetic-field zone Z1 is in a range from about 2 to about 50. For example, the number of electromagnets 73 in the magnetic-field zone Z1 is in a range from about 3 to about 10.

In some embodiments, as shown in FIGS. 4A and 4B, one of the electromagnets 73 at the center of the magnetic-field zone Z1 has a first pole. Some of the electromagnets 73 around the electromagnet 73 having the first pole have a second pole. The first pole is different from the second pole. For example, the first pole is a north pole, and the second pole is a south pole. In another example, the first pole is a south pole, and the second pole is a north pole.

In some embodiments, the strength of the magnetic field generated by the electromagnets 73 in the magnetic-field zone Z1 is in a range from about 1000 gauss to about 10000 gauss. For example, the strength of the magnetic field is in a range from about 5000 gauss to about 6000 gauss.

In some embodiments, the number of electromagnets 73 having a first pole is in a range from about 1 to about 7. The number of electromagnets 73 having a second pole is in a range from about 1 to about 30.

The location of the magnetic-field zone Z1 is adjusted along a moving path P1 by switching the electromagnets 73. In some embodiments, the moving path P1 is a circular path or a polygon path around the center of the electromagnet array 72 as shown in FIGS. 4A and 4B. In some embodiments, the rotation speed of the magnetic-field zone Z1 around the center of the electromagnets 73 is in a range from about 10 rpm to about 300 rpm. In some embodiments, the electromagnets 73 in a central zone Z3 are omitted. In other words, the electromagnet array 72 is a ring shape. In some embodiments, the location of the magnetic-field zone Z1 is adjusted at random.

As shown in FIG. 4C, the moving path P2 is a spiral path. The magnetic-field zone Z1 is spirally moved from the edge of the electromagnet array 72 toward the center of the electromagnet array 72, and afterwards the magnetic-field zone Z1 is spirally moved from the center of the electromagnet array 72 toward the edge of the electromagnet array 72.

Figure 5:
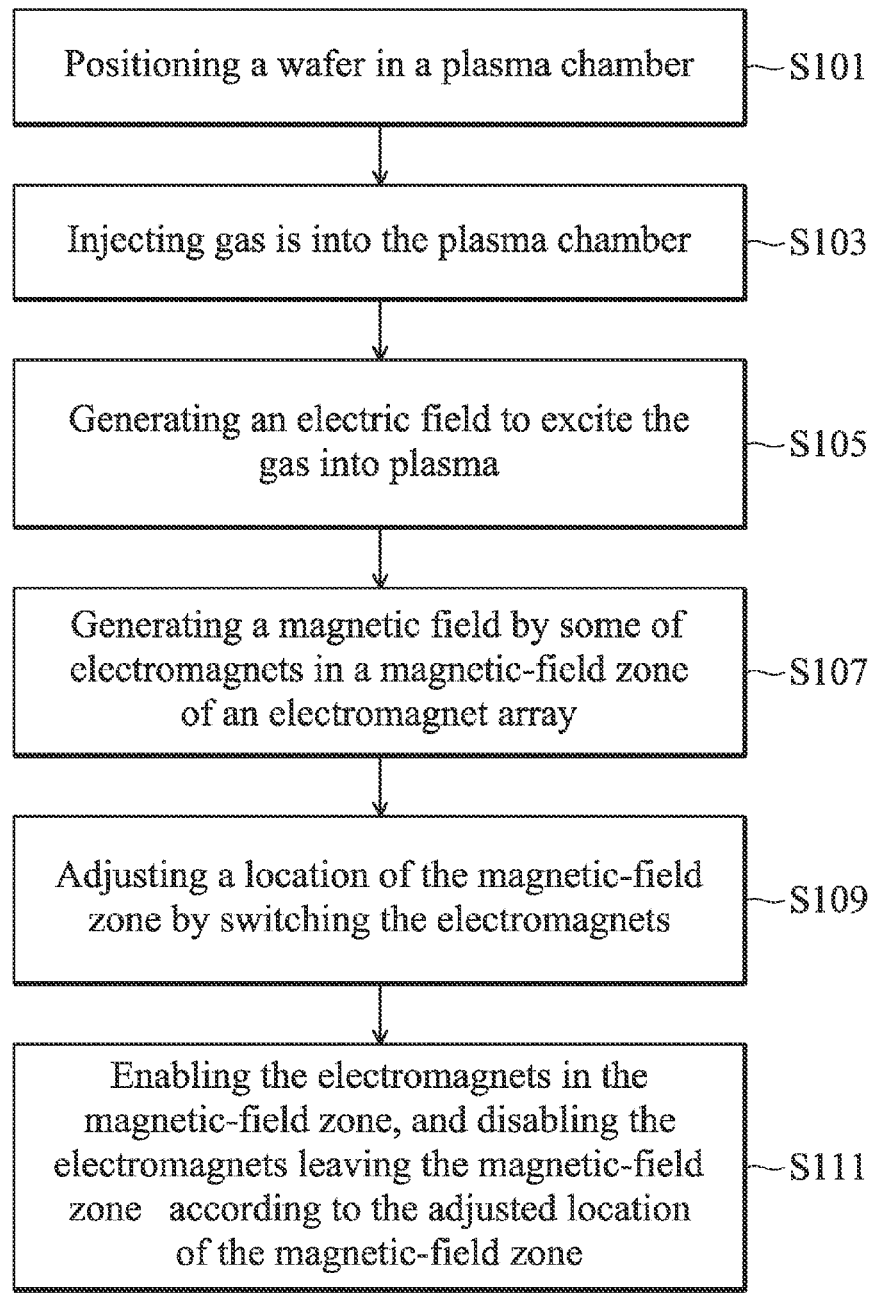
FIG. 5 is a flow chart of a semiconductor manufacturing method in accordance with some embodiments of the disclosure.

FIG. 5 is a flow chart of a semiconductor manufacturing method in accordance with some embodiments of the disclosure. The semiconductor manufacturing process is performed by following steps. In step S101, a wafer W1 is positioned on the wafer chuck 30 in the plasma chamber 10. In step S103, the gas is injected into the plasma chamber 10. The vacuum device 90 maintains the pressure of the plasma chamber 10 at the low-pressure environment.

In step S105, the power source 60 is enabled, and the electric field is generated by the enclosure element 40 and the target element 50. The gas is excited into plasma E1 by the electric field. The plasma E1 contains electrons and positive ions i1. The ions i1 are attracted to the target element 50. When the ions hit the target element 50, the target element 50 sputters metal atoms M1 on the wafer W1.

A magnetic-field controlling method is performed to the magnetic field generator 70 of the plasma apparatus 1 as shown in FIG. 1 during the semiconductor manufacturing process. In step S107, the magnetic field generator 70 generates a magnetic field. As shown in FIGS. 4A and 5, some of the electromagnets 73 in the magnetic-field zone Z1 of the electromagnet array 72 are enabled. Therefore, a magnetic field is generated by the electromagnets 73 in the magnetic-field zone Z1. The magnetic field further attracts more ions i1 to hit the target element 50.

In step S109, the location of the magnetic-field zone Z1 is adjusted by switching the electromagnets 73 in the electromagnet array 72. In some embodiments, the location of magnetic-field zone Z1 is adjusted along a circular path, a polygon path or a spiral path as shown in FIGS. 4A, 4B and 4C.

In step S111, the control module A1 (as shown in FIG. 2) enables the electromagnets 73 in the magnetic-field zone Z1 according to the position of the magnetic-field zone Z1. The control module A1 also adjusts one or some of the electromagnets 73 in the magnetic-field zone Z1 having the first pole adjacent to the target element 50. The control module A1 adjusts one or some of electromagnets 73 in the magnetic-field zone Z1 having a second pole adjacent to the target element 50.

The control module A1 further disables the electromagnets 73 leaving the magnetic-field zone Z1. In some embodiments, the electromagnets 73 in the magnetic-field zone Z1 are disabled after a predetermined time during the movement of the magnetic-field zone Z1. In other words, the electromagnets 73 in the magnetic-field zone Z1 are leaving the magnetic-field zone Z1 after the predetermined time during the movement of the magnetic-field zone Z1. In some embodiments, the predetermined time is in a range of $10^{-3}$ seconds to about 1 second.

In some embodiments, the control module A1 adjusts the strength of the magnetic field during the movement of the magnetic-field zone Z1. In some embodiments, the control module A1 adjusts the strength of the magnetic field according to the position of the magnetic-field zone Z1. In some embodiments, the control module A1 adjusts the strength of the magnetic field depending on the time that the semiconductor manufacturing process takes to perform.

In some embodiments, the control module A1 adjusts the area of the magnetic-field zone Z1 during the movement of the magnetic-field zone Z1. In other words, the number of electromagnets 73 in the magnetic-field zone Z1 is changed according to the area of the magnetic-field zone Z1. In some embodiments, the control module A1 adjusts the area of the magnetic field according to the position of the magnetic-field zone Z1. In some embodiments, the control module A1 adjusts the area of the magnetic field depending on the time that the semiconductor manufacturing process takes to perform.

By the magnetic-field controlling method, the magnetic field is adjusted accurately. Therefore, the metal atoms M1 emitting to the wafer W1 (as shown in FIG. 1) can be controlled accurately and uniformly.

Figure 6:
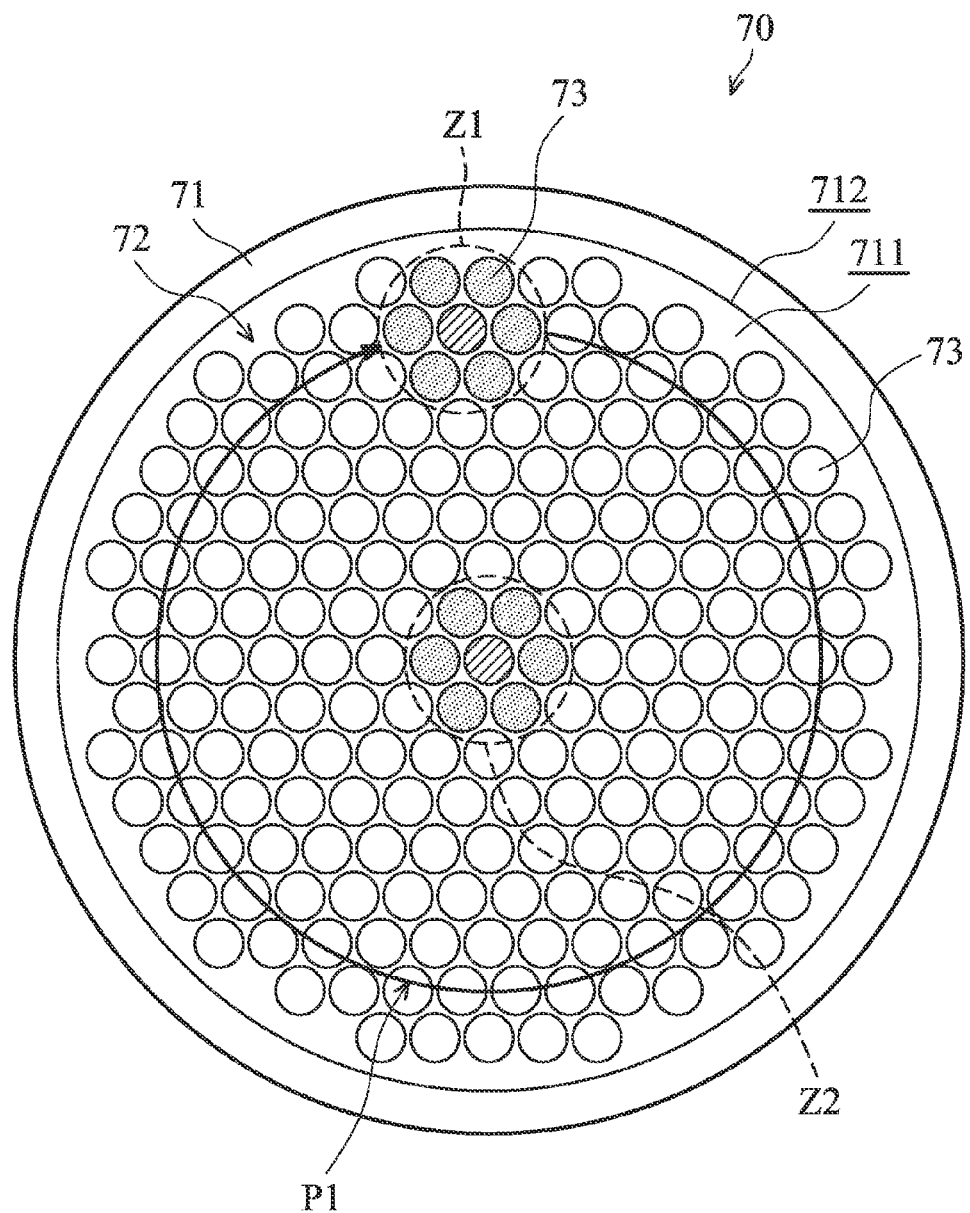
FIG. 6 is a bottom view of the magnetic field generator in accordance with some embodiments of the disclosure.
Figure 7:
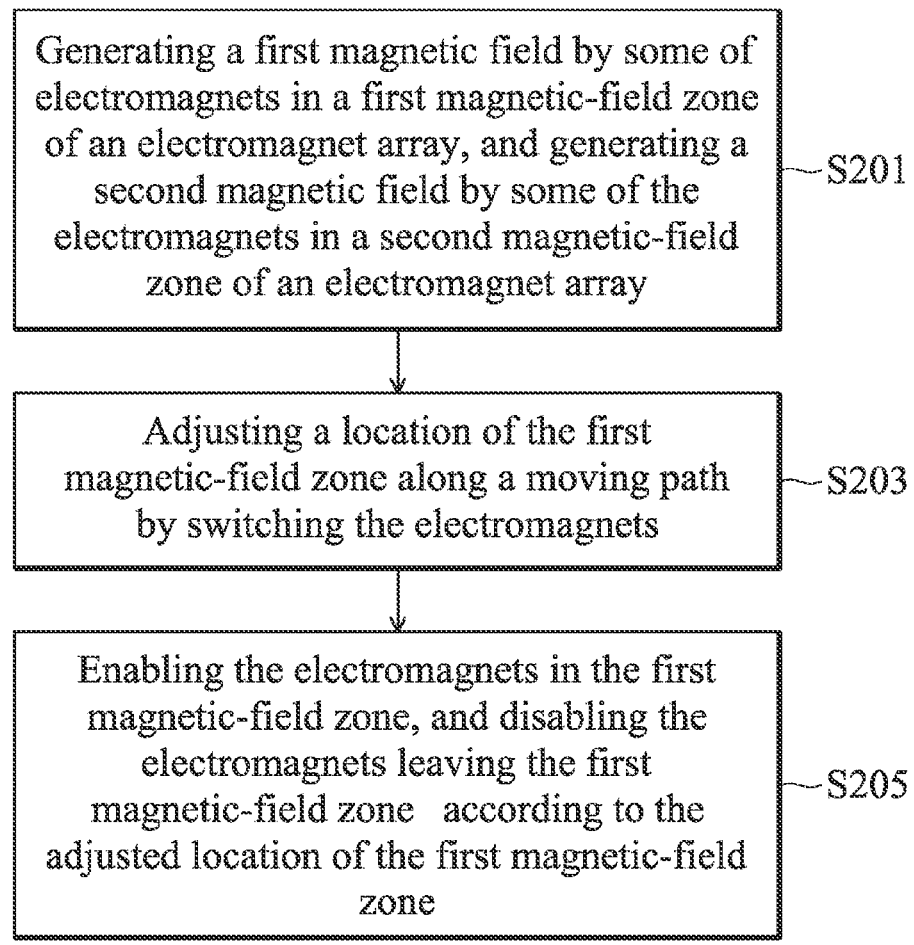
FIG. 7 is a flow chart of a magnetic-field controlling method in accordance with some embodiments of the disclosure.

FIG. 6 is a bottom view of a magnetic field generator 70 in accordance with some embodiments of the disclosure. FIG. 7 is a flow chart of a magnetic-field controlling method in accordance with some embodiments of the disclosure. As shown in FIG. 6, the electromagnet array 72 has two magnetic-field zones (a first and a second magnetic-field zone Z1s) Z1 and Z2.

In step S201, as shown in FIGS. 6 and 7, some of the electromagnets 73 in the first and the second magnetic-field zones Z1 and Z2 of the electromagnet array 72 are enabled. Therefore, the electromagnets 73 in the first magnetic-field zone Z1 generate a first magnetic field. The electromagnets 73 in the second magnetic-field zone Z2 generate a second magnetic field.

In step S203, the location of the first magnetic-field zone Z1 is adjusted by switching the electromagnets 73. In some embodiments, the location of the first magnetic-field zone Z1 is adjusted at random or along the moving path P1, such as a circular path, a polygon path or a spiral path. In some embodiments, the second magnetic-field zone Z2 is fixed. In some embodiments, the second magnetic-field zone Z2 is located at the center of the electromagnet array 72. In some embodiments, the location of the second magnetic-field zone Z2 is adjusted at random or along a moving path, such as a circular path, a polygon path or a spiral path.

In step S205, the control module A1 (as shown in FIG. 2) enables the electromagnets 73 in the first magnetic-field zone Z1. The control module A1 also adjusts one or some of the electromagnets 73 in the first magnetic-field zone Z1 having the first pole adjacent to the target element 50. The control module A1 adjusts one or some of electromagnets 73 in the first magnetic-field zone Z1 having a second pole adjacent to the target element 50. The control module A1 further disables the electromagnets 73 leaving the first magnetic-field zone Z1.

In some embodiments, the location of the second magnetic-field zone Z2 is adjusted at random or along a moving path by switching the electromagnets 73. The control module A1 further enables the electromagnets 73 in the second magnetic-field zone Z2, and disables the electromagnets 73 leaving the second magnetic-field zone Z2. The control module A1 also adjusts one or some of the electromagnets 73 in the second magnetic-field zone Z2 having the first pole adjacent to the target element 50. The control module A1 adjusts one or some of electromagnets 73 in the second magnetic-field zone Z2 having a second pole adjacent to the target element 50.

In some embodiments, the strength of the magnetic field generated by the electromagnets 73 in the first magnetic-field zone Z1 is the same as the strength of the magnetic field generated by the electromagnets 73 in the second magnetic-field zone Z2. In some embodiments, the strength of the magnetic field generated by the electromagnets 73 in the first magnetic-field zone Z1 is different from the strength of the magnetic field generated by the electromagnets 73 in the second magnetic-field zone Z2.

Embodiments of a plasma apparatus and a magnetic-field controlling method are provided. Since the magnetic field is generated by an electromagnet array of a magnetic field generator, the magnetic field can be controlled accurately by the magnetic-field controlling method. For example, the strength and the speed of the movement of the magnetic field can be adjusted accurately according to different semiconductor manufacturing processes. Furthermore, the path of the movement of the magnetic field also can be designed according to different conditions. Therefore, the metal atoms emitting to the wafer can be controlled accurately and uniformly by the magnetic field generator and the magnetic-field controlling method.

In some embodiments, a plasma apparatus is provided. The plasma apparatus includes a processing chamber and a wafer chuck disposed in the processing chamber. The plasma apparatus also includes a target element located over the wafer chuck and an electromagnet array located over the target element and having a number of electromagnets. Some of the electromagnets in a magnetic-field zone of the electromagnet array are enabled to generate a magnetic field adjacent to the target element. The location of the magnetic-field zone is adjusted by switching the electromagnets during a semiconductor manufacturing process.

In some embodiments, a magnetic-field controlling method for a plasma apparatus is provided. The magnetic-field controlling method includes generating a magnetic field by some of the electromagnets in a magnetic-field zone of an electromagnet array. The magnetic-field controlling method also includes adjusting a location of the magnetic-field zone by switching the electromagnets. The magnetic-field controlling method further includes enabling the electromagnets in the magnetic-field zone, and disabling the electromagnets leaving the magnetic-field zone according to the adjusted location of the magnetic-field zone.

In some embodiments, a semiconductor manufacturing method is provided. The semiconductor manufacturing process includes positioning a wafer in a plasma chamber and generating a magnetic field by some of a plurality of electromagnets in a magnetic-field zone of an electromagnet array to attract a plurality of ions in the plasma chamber to hit a target element. When the ions hit the target element, the target element sputters a plurality of metal atoms on the wafer. The semiconductor manufacturing process also includes adjusting a location of the magnetic-field zone by switching the electromagnets. The semiconductor manufacturing process further includes enabling the electromagnets in the magnetic-field zone, and disabling the electromagnets leaving the magnetic-field zone according to the adjusted location of the magnetic-field zone.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A plasma apparatus, comprising:
   a plasma chamber;
   a wafer chuck disposed in the plasma chamber;
   a target element located over the wafer chuck;
   a retaining element located above the target element, the retaining element comprising a circular shape and a circular receiving groove disposed in the retaining element; and
   an electromagnet array, located over the target element, comprising a plurality of electromagnets that are arranged in the receiving groove,
   wherein some of the electromagnets in a first magnetic-field zone of the electromagnet array are enabled to generate a first magnetic field adjacent to the target element, wherein the some of the electromagnets are arranged in an approximately circular pattern, and the some of the electromagnets comprises a first group of electromagnets and a central electromagnet surrounded by the first group of electromagnets, wherein the first group of electromagnets each comprise a pole that is opposite a pole of the central electromagnet,
   wherein a location of the first magnetic-field zone is adjusted by switching the electromagnets during a semiconductor manufacturing process,
   wherein some of the electromagnets in a second magnetic-field zone of the electromagnet array are enabled to generate a second magnetic field adjacent to the target element, and at least one of the electromagnets between the first magnetic-field zone and the second magnetic-field zone is disabled.

2. The plasma apparatus as claimed in claim 1, further comprising a control module configured to enable the electromagnets in the first magnetic-field zone, and to disable the electromagnets leaving the first magnetic-field zone.

3. The plasma apparatus as claimed in claim 1, further comprising a control module configured to adjust the strength of the first magnetic field.

4. The plasma apparatus as claimed in claim 1, wherein the location of the first magnetic-field zone is adjusted along a moving path.

5. The plasma apparatus as claimed in claim 4, wherein the moving path is a circular path, a polygon path or a spiral path.

6. The plasma apparatus as claimed in claim 1, wherein the electromagnet array is a ring shape or a circular shape.

7. The plasma apparatus as claimed in claim 1, wherein the central electromagnet in the first magnetic-field zone has a first pole adjacent to the target element, and the first group of electromagnets in the first magnetic-field zone have a second pole adjacent to the target element.

8. A magnetic-field controlling method for a plasma apparatus, comprising:
generating a first magnetic field by some of a plurality of electromagnets in a first magnetic-field zone of an electromagnet array, and generating a second magnetic field by some of the electromagnets in a second magnetic-field zone of the electromagnet array, wherein at least one of the electromagnets between the first magnetic-field zone and the second magnetic-field zone is disabled,
adjusting a location of the first magnetic-field zone by switching the electromagnets; and
enabling the electromagnets in the first magnetic-field zone, and disabling the electromagnets leaving the first magnetic-field zone according to the adjusted location of the first magnetic-field zone, wherein the enabled electromagnets are arranged in an approximately circular pattern, and the enabled electromagnets comprise a first group of electromagnets and a central electromagnet surrounded by the first group of electromagnets, wherein the first group of electromagnets each comprise a pole that is opposite a pole of the central electromagnet.

9. The magnetic-field controlling method as claimed in claim 8, further comprising adjusting a strength of the first magnetic field.

10. The magnetic-field controlling method as claimed in claim 8, wherein adjusting a location of the first magnetic-field zone by switching the electromagnets along a moving path.

11. The magnetic-field controlling method as claimed in claim 8, further comprising adjusting the central electromagnet in the first magnetic-field zone having a first pole adjacent to a target element, and adjusting the first group of electromagnets in the first magnetic-field zone having a second pole adjacent to the target element.

12. A semiconductor manufacturing method, comprising:
positioning a wafer in a plasma chamber;
generating a first magnetic field by some of a plurality of electromagnets in a first magnetic-field zone of an electromagnet array and generating a second magnetic field by some of the electromagnets in a second magnetic-field zone of the electromagnet array to attract a plurality of ions in the plasma chamber to hit a target element, wherein at least one of the electromagnets between the first magnetic-field zone and the second magnetic-field zone is disabled, and when the ions hits the target element, the target element sputters a plurality of metal atoms on the wafer;
adjusting a location of the first magnetic-field zone by switching the electromagnets; and
enabling the electromagnets in the first magnetic-field zone, and disabling the electromagnets leaving the first magnetic-field zone according to the adjusted location of the first magnetic-field zone, wherein the enabled electromagnets are arranged in an approximately circular pattern, and the enabled electromagnets comprise a first group of electromagnets and a central electromagnet surrounded by the first group of electromagnets, wherein the first group of electromagnets each comprise a pole that is opposite a pole of the central electromagnet.

13. The semiconductor manufacturing method as claimed in claim 12, further comprising adjusting a strength of the first magnetic field.

14. The semiconductor manufacturing method as claimed in claim 12, further comprising generating an electric field to excite a gas in the plasma chamber into plasma, which includes the ions.

15. The semiconductor manufacturing method as claimed in claim 12, wherein adjusting a location of the first magnetic-field zone by switching the electromagnets along a moving path.

16. The semiconductor manufacturing method as claimed in claim 15, wherein the moving path is a circular path, a polygon path or a spiral path.

17. The semiconductor manufacturing method as claimed in claim 12, further comprising adjusting the central electromagnet in the first magnetic-field zone having a first pole adjacent to a target element, and adjusting the first group of electromagnets in the first magnetic-field zone having a second pole adjacent to the target element.

18. The plasma apparatus as claimed in claim 1, wherein the first magnetic field and the second magnetic field are simultaneously generated by the electromagnets in the first and the second magnetic-field zones.

19. The plasma method as claimed in claim 8, wherein the first magnetic field and the second magnetic field are simultaneously generated by the electromagnets in the first and the second magnetic-field zones.

20. The plasma method as claimed in claim 12, wherein the first magnetic field and the second magnetic field are simultaneously generated by the electromagnets in the first and the second magnetic-field zones.

* * * * *